United States Patent [19]
Salmon et al.

[11] Patent Number: 5,159,672
[45] Date of Patent: Oct. 27, 1992

[54] BURST EPROM ARCHITECTURE

[75] Inventors: Joseph H. Salmon, Placerville; Robert E. Larsen, Shingle Springs; David A. Leak, Rancho Cordova; Kurt B. Robinson, Newcastle; Dhiraj Parmar, Diamond Springs, all of Calif.

[73] Assignee: Intel Corporation, Santa Clara, Calif.

[21] Appl. No.: 458,141

[22] Filed: Dec. 28, 1989

[51] Int. Cl.⁵ ............................................. G06F 13/28
[52] U.S. Cl. ............................. 395/325; 364/DIG. 1; 364/239.1; 364/DIG. 2; 364/977.5
[58] Field of Search ... 364/200 MS File, 900 MS File; 395/325, 425

[56] References Cited

U.S. PATENT DOCUMENTS 4,912,630 3/1990 Cochroft, Jr. .................. 364/200
5,058,005 10/1991 Culley ............................ 364/200

Primary Examiner—Michael R. Fleming
Assistant Examiner—Debra A. Chun
Attorney, Agent, or Firm—Blakey, Sokoloff, Taylor & Zafman

[57] ABSTRACT

Circuitry which when combined with an EPROM in a single integrated circuit for connection to a microprocessor which provides suitable signals utilized by the additional circuitry to provude faster access to the code or data stored in the EPROM than can be accomplished without such additional circuitry by providing zero wait state burst performance. A state machine is utilized to manage the interface between the microprocessor and the burst EPROM.

9 Claims, 9 Drawing Sheets

BURST EPROM ARCHITECTURE

SUMMARY OF THE INVENTION

The present invention is directed to circuitry which used in combination with an EPROM device and a microprocessor provides faster access to code and data stored in the EPROM to the processor at a cost which is much lower than available prior art solutions. The additional circuitry is combined with an existing EPROM in a single integrated circuit for connection to a microprocessor which provides suitable signals which are utilized by the additional circuitry to provide faster access to the code or data stored in the EPROM than can be accomplished without such additional circuitry.

EPROMs are well-known as devices which are used to store program code instructions for execution by a microprocessor to enable the microprocessor to perform desired tasks. Such EPROM and microprocessor combinations are generally referred to as embedded applications. However, due to the relatively fast speed of microprocessors, EPROMs typically degrade system performance due to wait states that must be inserted for each memory access. For example, if a two-byte instruction is to be executed, if the EPROM bus width is only eight bits wide, only a single byte of the two-byte instruction can be retrieved during each clock cycle of the processor. However, since a typical EPROM cannot be accessed at the same speed as the processor system clock, one or more system clock cycles must be allowed to elapse before the second byte of the instruction can be retrieved. These additional system clock cycles are called wait states and cause the microprocessor to execute at a speed which is slower than the speed at which it would otherwise be capable of executing. If the EPROM bus is, for example, 32 bit wide, only a single 32 bit word can be transferred before additional wait states must be inserted. For this reason, system designers often utilize a high-speed shadow RAM into which code from the EPROM is downloaded, or a fast EPROM /memory interleaving scheme. However, both of these solutions are relatively expensive in that the component cost of high-speed RAM is high and in view of the additional amount of integrated circuit space which is utilized by these approaches. The present invention which is called a burst EPROM offers zero wait state burst performance without the complexity or cost of prior art solutions.

In the preferred embodiment, the invented burst EPROM is externally configured as a 128K by 8-bit EPROM with a synchronous 4-byte burst. The 8-bit configuration is the preferred embodiment on the basis of area, noise and pinout, but of course configurations other than 8-bit configurations are possible which would require changes to the invention as disclosed herein, which changes would be readily apparent to persons skilled in the art. The 4-byte burst was selected since four bytes of linear program code is frequently encountered, but again, the changes which would be necessary to provide 2-byte, 8-byte, 16-byte or the like bursts will be apparent to persons skilled in the art.

A state machine is utilized to manage the interface between the microprocessor and the burst EPROM. In this connection, in the preferred embodiment, the microprocessor is an 80960CA microprocessor manufactured by Intel Corporation which provides the following signals to the burst EPROM:

1. Address strobe (/ADS) which indicates valid address and the start of a new bus access. /ADS is asserted for the first clock of a bus access.

2. Processor output clock (PCLK2 or PCLK1) which provides a timing reference for all inputs and outputs of the processor. All inputs and outputs timings are specified in relation to PCLK1 and PCLK2, which are identical signals provided to allow flexibility in the system's allocation of capacitive loading on the clock. For convenience, references herein to CLK should be understood to be references to PCLK1 or PCLK2 generated by the 80960CA microprocessor.

3. Burst last (/BLAST) which indicates the last transfer in a bus access. /BLAST is asserted in the last data transfer of burst and non-burst accesses after the wait state counter of the processor reaches zero. /BLAST remains active until the clock following the last cycle of the last data transfer of a bus access.

4. Address bus (A2:A18) which carries the upper seventeen bits of the physical address. A18 is the most significant bit and A2 is the least significant. During a bus access, A18-A2 identify all external addresses to word (4-byte) boundaries in the EPROM. During burst accesses, A3 and A2 increment to indicate successive data bytes.

5. Byte enables (/BE0 and /BE1) specify which four bytes addressed by A2:A16 (for 8 bit data bus) or by (A3:A17 (for 16 bit data bus) are active during an access to a memory region configured for a 32 bit data bus.

Although not generated directly by the microprocessor, also provided is a chip select signal (/CS) which is used to select the EPROM or EFROMs being addressed. /CS is generated by an address decoder whenever the address on the address bus is within the range of the EPROM address space.

A burst access begins on the first CLK after /ADS and /CS are asserted. In the following discussion, the terminology employed is terminology consistent with the Intel 80960CA microprocessor as defined in the 80960CA User's Manual available from Intel Corporation as its order number 270710-001.

The state machine is in an idle state so long as /ADS and /CS are 1. The address is latched during a first wait state. After one or two wait states, depending upon the speed of the processor and EPROMs being utilized, data is output one byte at a time on each subsequent clock cycle. The byte order of the data is based upon a decode of A2 and A3 which are internally incremented during the burst cycle. A burst access is terminated at the rising edge CLK when /BLAST is asserted. The bus bandwidth may be expanded by pipelining the next address with the last data byte. If /BLAST is not asserted during the fourth data byte, the device goes into a "boot" mode or state. The boot state eliminates the need for asynchronous EPROM for system initialization. That is, the boot state provides a simple asynchronous access which provides the microprocessor with region table information, i.e., memory system requirements.

The clock scheme uses two sets of non-overlapping clocks to synchronize inputs to the device and clock the state machine and the burst circuitry. That is, the signal CLK is used to generate the signals CK and /CK as well as phase1 (PH1) and phase2 (PH2). The two sets of clock signals increase the margin for inputs to the state input machine and distribute power consumption in the state machine and burst circuitry over the clock cycle, thus reducing noise on the output data bus.

DETAILED DESCRIPTION OF THE INVENTION

Figure 1:
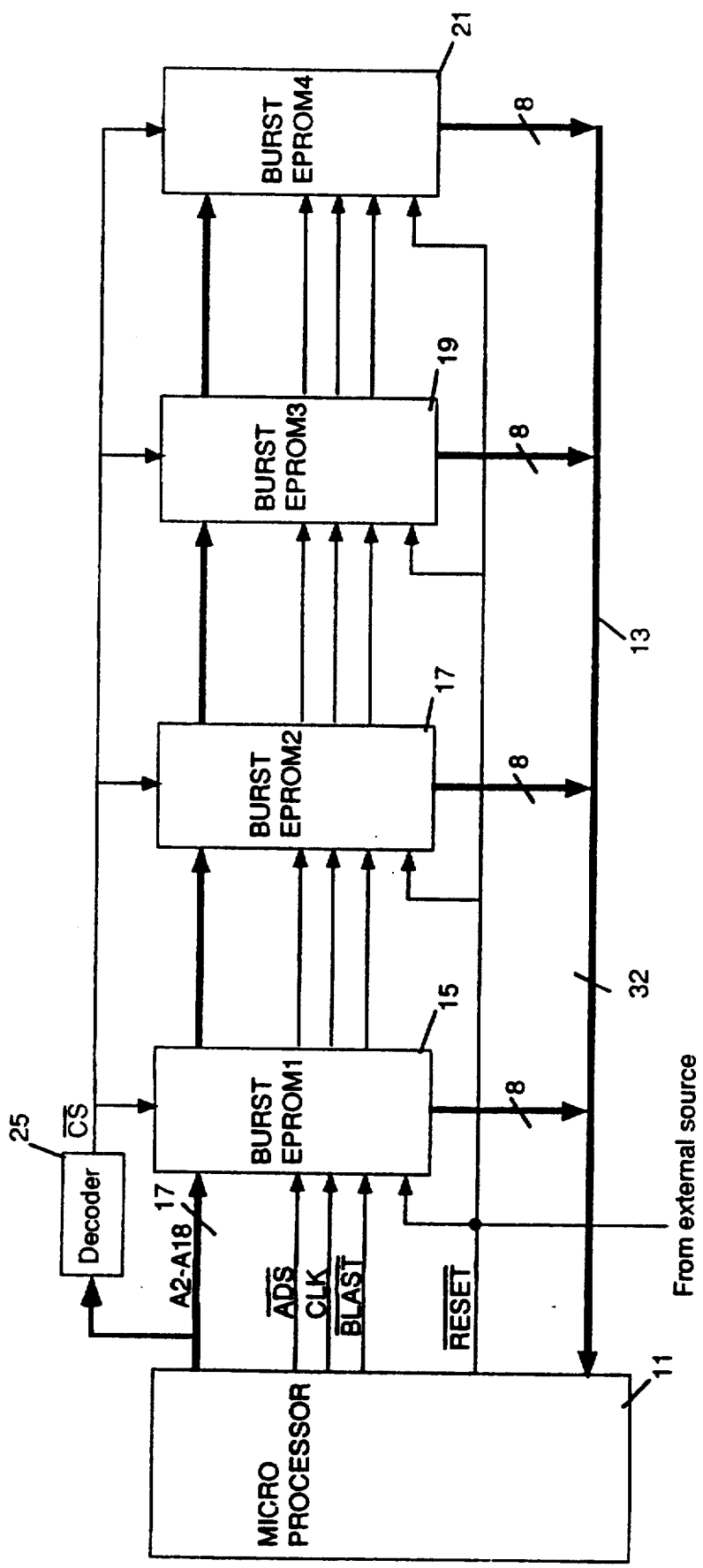
FIG. 1 is a block overview diagram showing burst EPROMs connected to a microprocessor in a first embodiment of the invention.

FIG. 1 is a block overview diagram showing a microprocessor 11 connected via a 32 bit data bus 13 to four burst EPROMs according to the present invention, namely burst EPROM1 15, burst EPROM2 17, burst EPROM3 19 and burst EPROM4 21. As shown in FIG. 1, each burst EPROM receives a 17 bit address from the microprocessor address bus A2-A18, and the signals /ADS, CLK, /BLAST and /RESET. Also shown in FIG. 1 is decoder 25 which receives lines from the address bus and generates a chip select signal /CS if the address on the address bus is within the address space of the EPROMs.

In the preferred embodiment, microprocessor 11 is an 80960CA microprocessor available from Intel Corporation which generates the foregoing signals in a manner which will be readily apparent to persons skilled in the art as such signals are defined in the 80960CA User's Manual available from Intel Corporation as its Order No. 270710-001. Of course, other microprocessors may be utilized in which case the address bus and other signals generated by microprocessor 11 would also need to be generated in a similar manner. For this reason, the implementation details regarding microprocessor 11 will not be set forth herein in order to avoid unnecessarily complicating the description of the invention. Additionally, decoder 25 will not be described herein as its implementation details will be readily apparent to persons skilled in the art. A suitable address decoder 25 is available from Intel Corporation as its Part No. 85C508.

Figure 2:
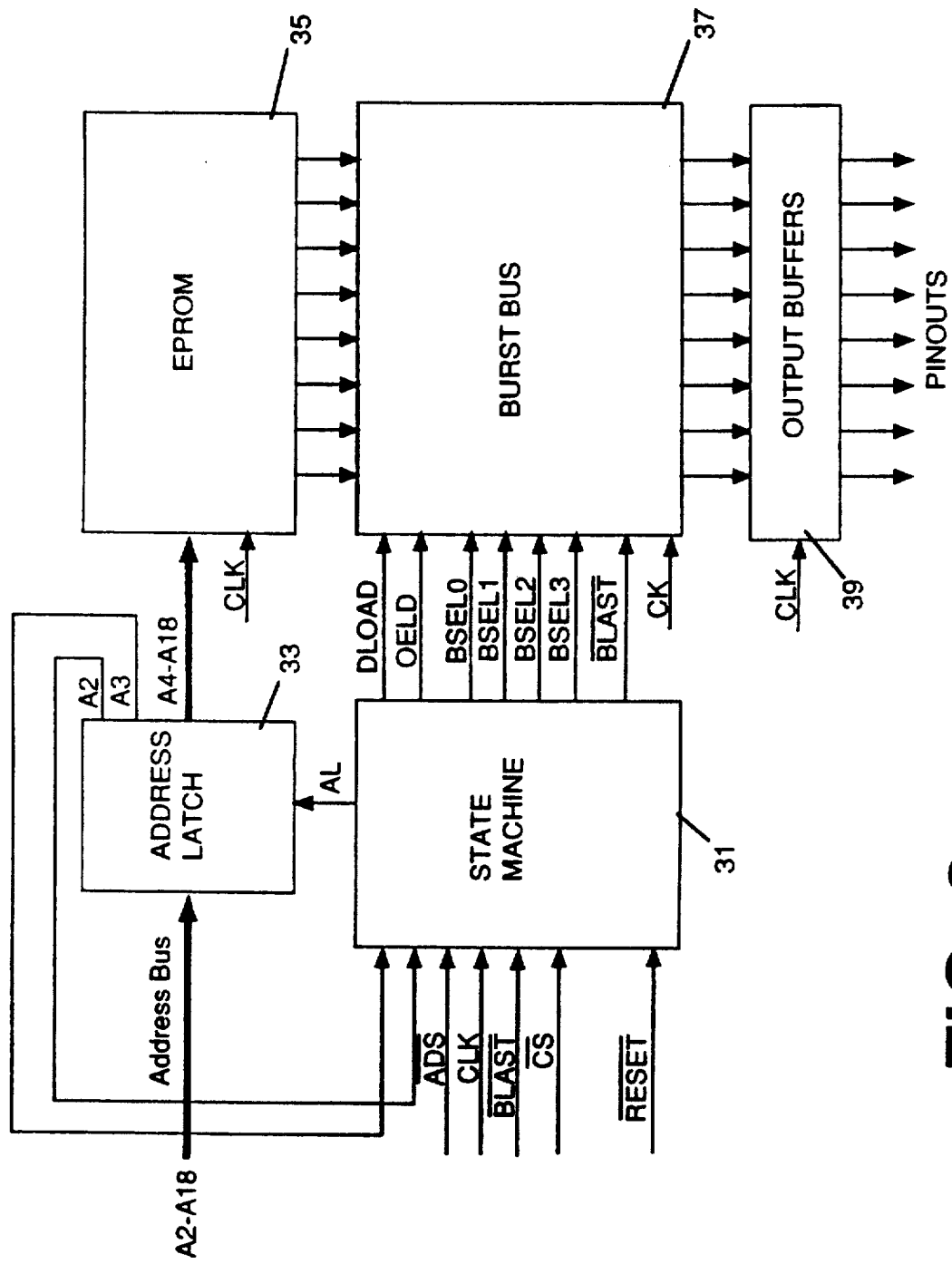
FIG. 2 is a block overview diagram showing the components of a single burst EPROM according to the present invention.

A single burst EPROM, that is, one of burst EPROMs 15, 17, 19 and 21, will now be described with reference to FIG. 2. In this connection, it should be noted that each of the four burst EPROMs shown in FIG. 1 are identical to the burst EPROM shown in FIG. 2. It should further be noted that although the following description is for a configuration wherein there is an 32 bit data bus being input to microprocessor 11, 16 bit bus and 8 bit bus configurations are also possible as will be described below in connection with alternate embodiments of the invention which will be described with reference to FIGS. 7-9. Additionally, it is not necessary that four EPROMs be used; single EPROM or two EPROM configurations are also possible as will be described with reference to FIGS. 7 and 8.

A burst EPROM according to the present invention comprises state machine 31, address latch 33, EPROM 35, burst bus 37 and output buffers 39 formed into an integrated circuit. The details for creating an address latch 33, EPROM 35 and output buffers 39 are well known in the prior art, and will not be described herein except to the extent necessary to obtain an understanding of the remaining components of the burst EPROM, namely state machine 31 and burst bus 37. It should be noted however that EPROM 35 is actually a 32K by 32 bit EPROM which is configured as four 32K by 8 bit EPROM arrays which externally form a 128K by 8 bit EPROM.

Address latch 33 comprises a 17-bit latch which captures information on the address bus when the address latch signal AL is asserted by state machine 31. The high order 15 bits (A18:A4) form a four byte word address which is provided by address latch 33 to EPROM 35 which places the addressed four bytes onto burst bus 37. The low order two bits (A3:A2) are input to state machine 31. Burst bus 37 processes the data under control of state machine 31 in a manner as will be described below with reference to FIGS. 4 and 5. Burst bus 37 places the processed data onto output buffers 39 for placement on the pinouts of the integrated circuit which forms the invented burst EPROM. The pinouts are then coupled to microprocessor 11 by bus 13.

Figure 3:
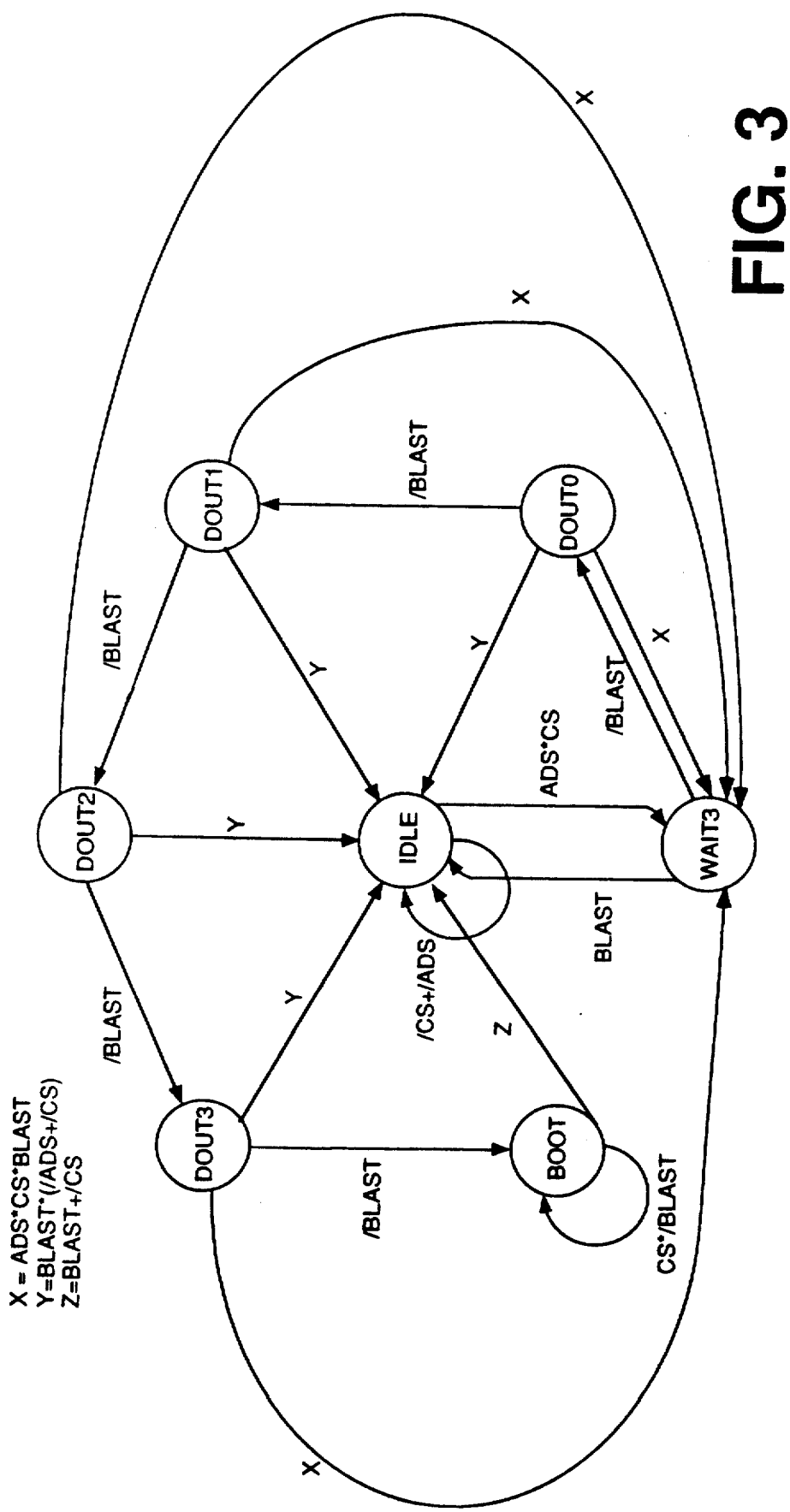
FIG. 3 is a state machine diagram for a state machine used by the present invention.

State machine 31 is a state machine implemented with D-latches and discrete logic which utilizes 7, 8 or 9 of 16 possible states. When utilizing 9 states, three wait states are included. When using less than 9 states, one or two of the wait states are omitted. In this connection, the following description will describe a state machine having seven states including only one wait state. A state machine utilizing eight or nine states would be identical excepting that there would be one or two additional wait states respectively. The seven states are IDLE, WAIT3, DOUT0, DOUT1, DOUT2, DOUT3 and BOOT as shown in FIG. 3. If needed, additional wait states, WAIT1 and WAIT2, would precede WAIT3. The additional two states, WAIT1 and WAIT2 are identical to WAIT3, but are only used for processor/EPROM combinations which require additional wait states. For example, the following table shows the number of wait states for EPROMs used in combinations with a processor having a 16, 20, 25 and 33 MHz clock

| Clock Speed | Wait States |
| --- | --- |
| 16 MHz | 1 |
| 20 MHz | 2 |
| 25 Mhz | 2 |
| 33 MHz | 3 |

For processors having other clock speeds, the number of wait states would need to be adjusted accordingly in a manner which will be readily apparent to persons skilled in the art. The state machine generates a data latch load signal (DLOAD), an output enable load signal (OELD), and four byte select signals (BSEL0, BSEL1, BSEL2 and BSEL3). The particulars of these signals will be described below with reference to FIGS. 2 to 5.

When power is first applied, and referring to FIG. 3, the state machine is in IDLE. /ADS and /CS are checked during the rising edge of CLK. If /ADS and /CS are asserted (/ADS=0 and /CS=0) the state machine goes to WAIT3; otherwise the state machine remains in the IDLE state until the next rising edge of CLK at which time /ADS and /CS are checked again.

In WAIT3, BLAST is checked at the rising edge of CLK, and if not asserted (BLAST=0), the state machine goes to DOUT0, otherwise it goes to IDLE. For a three wait state device, if /CS and /ADS are asserted on the rising edge of CLK while in IDLE, then the state machine goes to WAIT1; if /CS is still asserted on the next rising edge of CLK, then the state machine goes to WAIT2. Similarly, if /CS is still asserted on the next rising edge of CLK, then the state machine goes to WAIT3. For a two wait state device, if CS and /ADS are asserted on the rising edge of CLK while in IDLE, then the state machine goes to WAIT2; if /CS is still asserted on the next rising edge of CLK, then the state machine goes to WAIT3.

As previously noted, after WAIT3, the state machine then goes to DOUT0 if BLAST=0, otherwise the state machine goes back to IDLE.

During IDLE, AL is 1, DLOAD is 1 and OELD is 0. When the state machine goes to WAIT3, AL goes to 0 and the address on the address bus is latched by address latch 33 after which the latched 17 bit address is used to access EPROM 35, and the accessed 4 bytes are passed to burst bus 37. Additional wait states (WAIT1 and possibly WAIT2) would need to be inserted at this point if the speed of the processor (i.e., CLK) is such that the addressed byte cannot be passed to burst bus 37 during a single CLK cycle.

Once the state machine gets to DOUT0, AL is set back to 1, DLOAD is set to 0 and OELD is set to 1. The manner in which the signals are utilized will be described below with reference to FIG. 4 and the detailed description of burst bus 37. However, at the rising edge of each CLK, the state machine passes successively to DOUT1, DOUT2, DOUT3 and BOOT so long as BLAST is 0. If BLAST is 1 during the rising edge of CLK at DOUT1, DOUT2, DOUT3, the state machine goes back to IDLE rather than the next state.

Once in BOOT, the state machine stays in BOOT until CS=1 or BLAST=0 during the rising edge of CLK at which time the state machine goes back to IDLE.

While not shown, if /RESET is asserted during the rising edge of CLK, the state machine goes back to IDLE regardless of which state it is in.

State machine 31 generates BSEL0, BSEL1, BSEL2 and BSEL3 as follows. The address bus (A4:A18) from microprocessor 11 contains an address within a 32K by 32 bit address space of EPROM 35. However, assuming a four EPROM and 32 bit data bus configuration as shown in FIG. 1, it needs to beddetermined which of four possible bytes from the addressed EPROM 35 should be placed onto the data bus during each clock cycle. In this connection, the signals A2 and A3 are used to determine which of four 32K by 8 bit EPROM arrays (EPROM0 array, EPROM1 array, EPROM2 array, and EPROM3 array) which form EPROM 35 is to place its addressed byte on the data bus by initializing a counter to a number between 0 and 3 as shown in the following table. More particularly and referring to FIG. 4, the initial byte of data is accessed from the corresponding EPROM 35 in one f the EPROM0 array, EPROM1 array, EPROM2 array or EPROM3 array according to the following table:

| COUNTER | | EPROM Array | BYTE SELECT |
| A3 | A2 | | |
| --- | --- | --- | --- |
| 0 | 0 | 0 | BSEL0=1 |
| 0 | 1 | 1 | BSEL1=1 |
| 1 | 0 | 2 | BSEL2=1 |
| 1 | 1 | 3 | BSEL3=1 |

Thus, the EPROM0 array is accessed when the counter is 0; the EPROM1 array is accessed when the counter is 1; the EPROM2 array is accessed when the counter is 2; and the EPROM3 array is accessed when the counter is 3.

Once the initial byte has been placed on the data bus during state DOUT0 based upon A2 and A3, the internal counter is incremented such that in state DOUT1, a byte from the next EPROM array, as determined by the table, is placed onto the data bus. If the internal counter is at 3 (i.e., A3=1 and A2=1) or if it is incremented to 3, it is reset to 0 such that the counter is in effect, a modulo 4 counter. In a like manner, the internal counter is incremented for each of states DOUT2 and DOUT3 until all four of the EPROM arrays have placed their addressed byte into burst bus 37.

Figure 4:
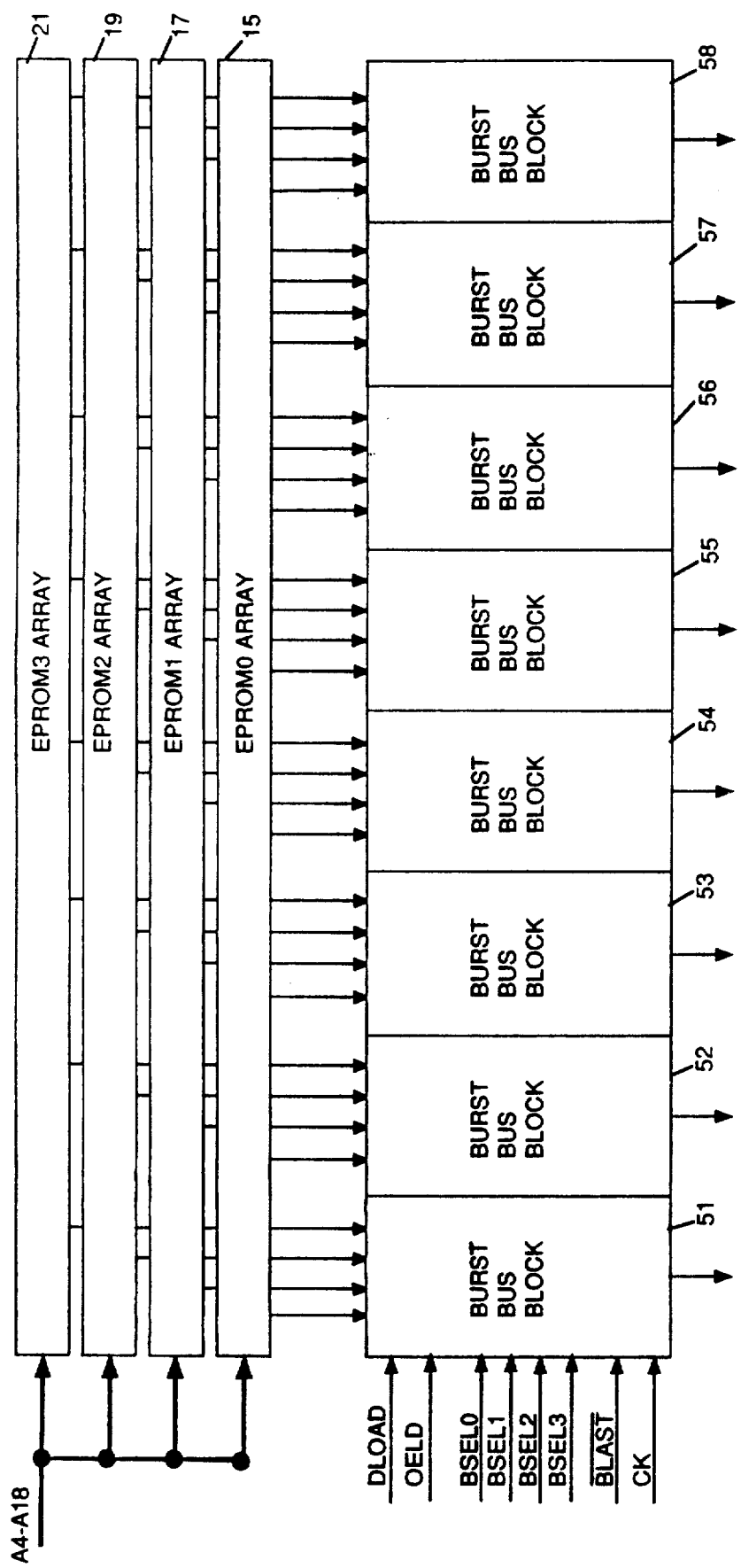
FIG. 4 is a block diagram showing a burst bus for an EPROM configuration according to the present invention.

Burst bus 37 will now be described with reference to FIGS. 4 and 5. Referring first to FIG. 4, burst bus 37 comprises eight burst bus blocks 51-58, each of which receives four lines, one from each of four EPROM arrays, namely EPROM0 array to EPROM3 array. When DLOAD is asserted (i.e., during WAIT1 and WAIT2 and WAIT3 if present), all inputs to each burst bus block 51-58 are loaded.

Figure 5:
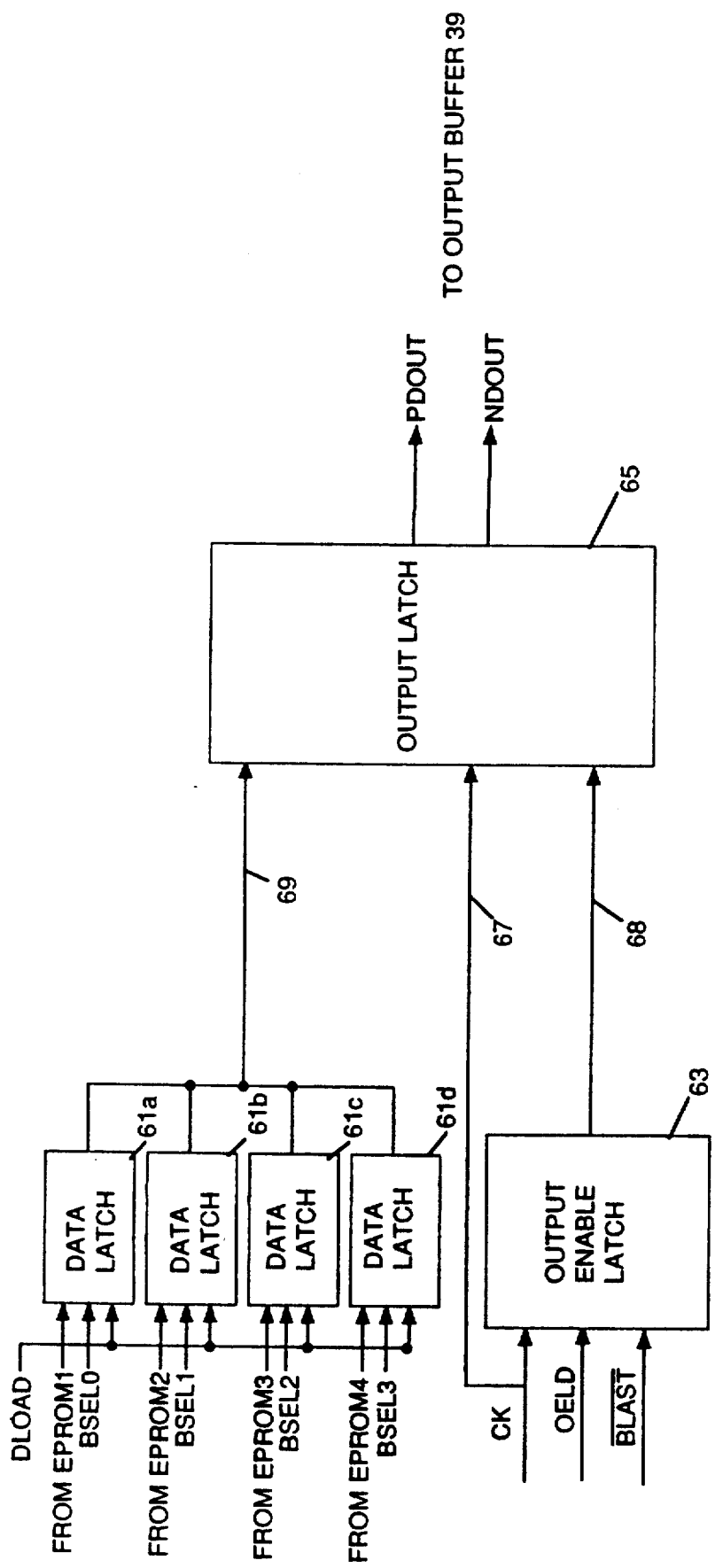
FIG. 5 is a block diagram of a data latch, output enable latch comprising a single burst bus latch.

More particularly, referring to FIG. 5, each burst bus block 51-58 comprises data latches 61a, 61b, 61c and 61d, an output enable latch 63, and an output latch 65. The data latches latch all inputs from the four EPROM arrays, EPROM0 array to EPROM3 array, when DLOAD is 0. If BSEL0 is asserted, latch 61a within each of the eight burst bus blocks 51 to 58 outputs a corresponding bit from EPROM0 array. Similarly, latches 61b to 61d latch corresponding bits from EPROM1 array to EPROM3 array respectively when BSEL1 to BSEL3 respectively are asserted. At the rising edge of CLK, if /BLAST is 1 and OELD is 1, output enable latch 63 generates a signal on line 68 to output latch 65 causing it to enable the data stored in data latch 65 to the corresponding output buffer 39 for placement on the corresponding pinout of the integrated circuit.

Figure 6:
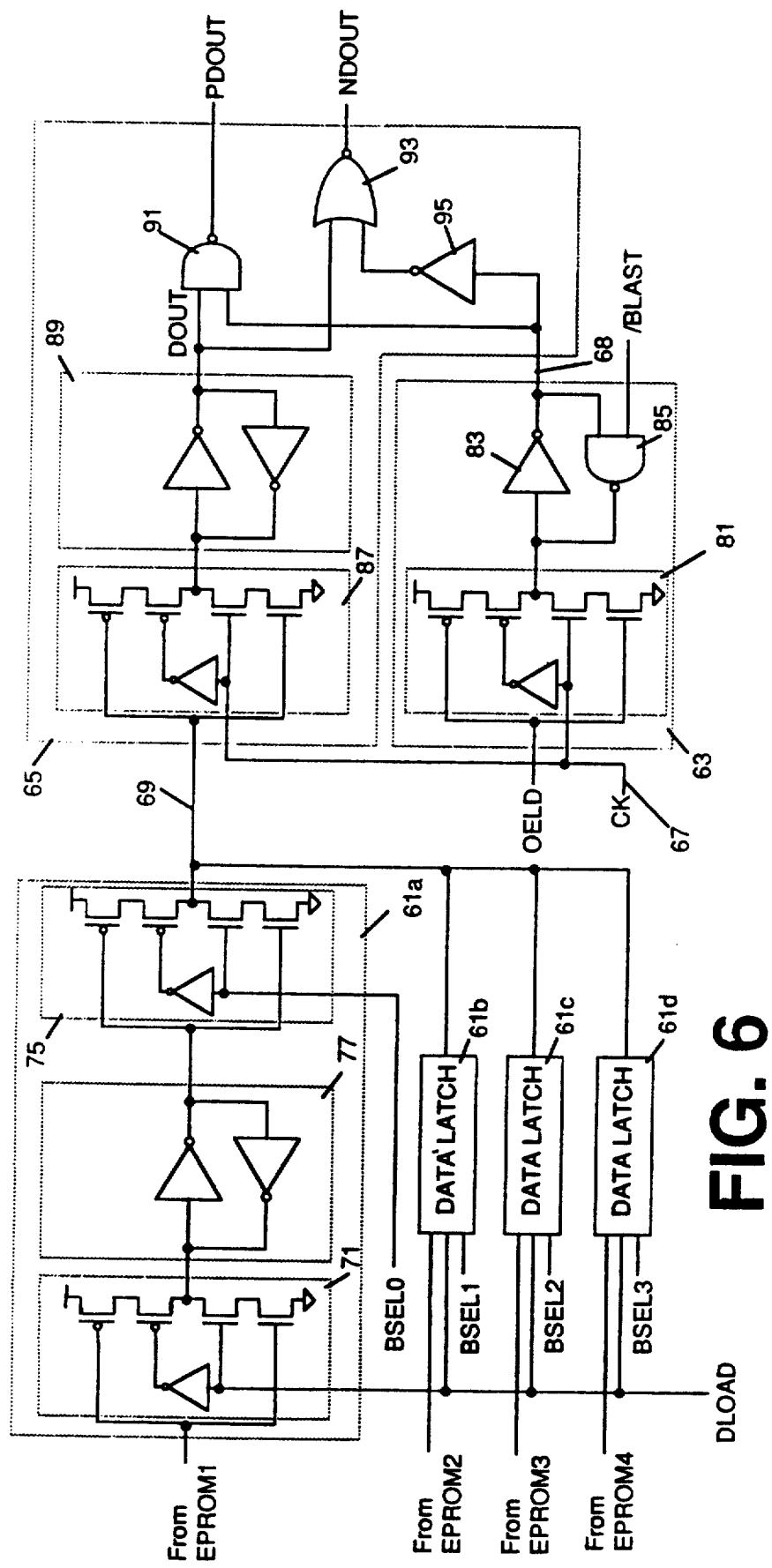
FIG. 6 is a detailed block diagram showing implementation details of a data latch, an output enable latch and an output latch.

The details of data latches 61a to 61d, output enable latch 63 and output latch 65 will now be described with reference to FIG. 6. For simplicity, only data latch 61a is shown in detail in FIG. 6. However, the structure of data latches 61b, 61c and 61d are identical. As shown in FIG. 6, data latch 61a comprises a pair of clocked inverters 71 and 75 which are coupled by cross coupled inverters 77. In this manner, when DLOAD is asserted, cross coupled inverters 77 store a corresponding bit from EPROM1. When BSEL0 is asserted, clocked inverter 75 enables the data stored in cross coupled inverters 77 onto common data bus 69.

Output enable latch 63 comprises a clocked inverter 81, inverter 83 and NAND gate 85. Output latch 65 comprises a clocked inverter 87, and cross coupled inverters 89 which are coupled to NAND gate 91 and NOR gate 93. The second input to NAND gate 91 is the output from output enable latch 63 and the second input to NOR gate 93 is the output from output enable latch 63 inverted by inverter 95. Clocked inverters 81 and 87 are clocked by the signal CK which is essentially the signal CLK.

The outputs PDOUT and NDOUT from output latch 65 are signals for the output pull-up device and output pull-down device in the output buffer, which as noted above is coupled to the pinouts of the invented burst EPROM which in turn are coupled to data bus 13.

Figure 7:
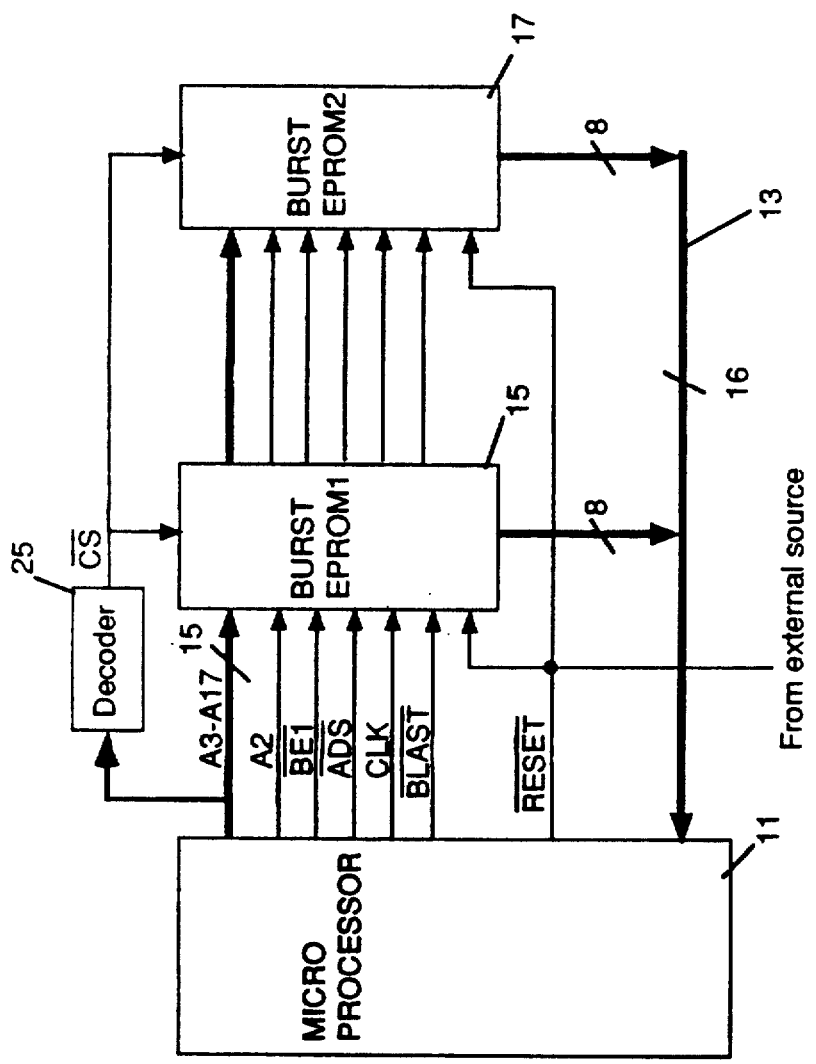
FIG. 7 is a block overview diagram showing burst EPROMs connected to a microprocessor in a second embodiment of the invention.

A second embodiment of the present invention will now be described with referenced FIG. 7 which shows a two burst EPROM configuration with a 16 bit data bus. In this case, the address from microprocessor 11 is placed on a 15 bit address bus A3-A17. This second embodiment differs from the embodiment described above with reference to FIG. 1 in that rather than receiving the signals A2 and A3 from microprocessor 11, burst EPROMs 15 and 17 in the FIG. 7 embodiment receive the signals A2 and /BE1 which are utilized by burst EPROMs 15 and 17 in a manner similar to the handling of the signals A2 and A3 by the FIG. 1 embodiment as described above except that EPROM arrays 0 to 3 are addressed by A17:A3 instead of A18:A4.

Figure 8:
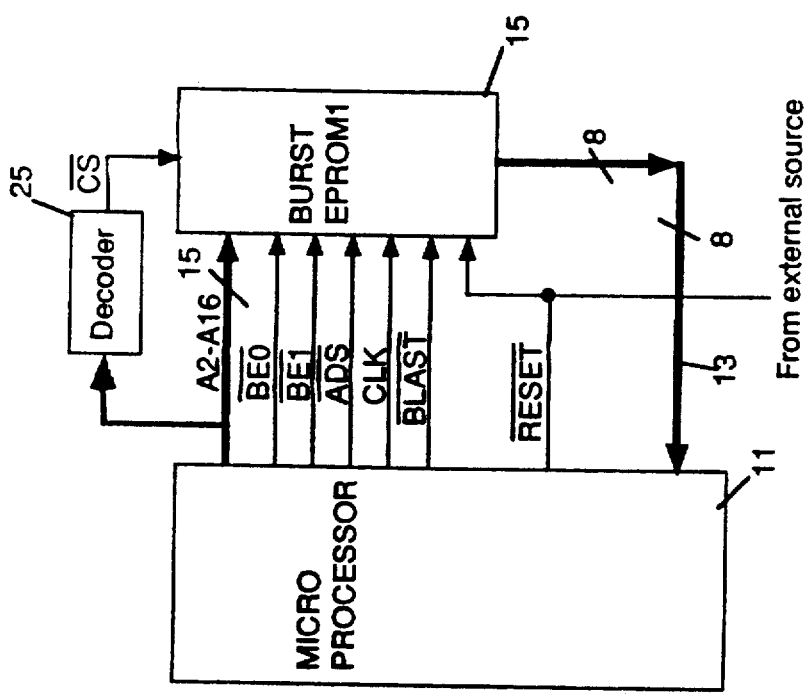
FIG. 8 is a block overview diagram showing burst EPROMs connected to a microprocessor in a third embodiment of the invention.

Referring now to FIG. 8, a third embodiment of the invention will be described having address a single burst EPROM 15 and an eight bit data bus. In this case, burst EPROM 15 receives a 15 bit address A2-A16, and signals /BE0 and /BE1 in conjunction with A2-A16 select a byte to be placed on data bus 13 in a manner similar to the embodiment described in FIG. 1 except that the signals /BE0 and /BE1 are utilized by burst EPROM 15 instead of the signals A2 and A3, and EPROM arrays 0 to 3 are addressed by A16:A2 instead of A18:A4.

Figure 9:
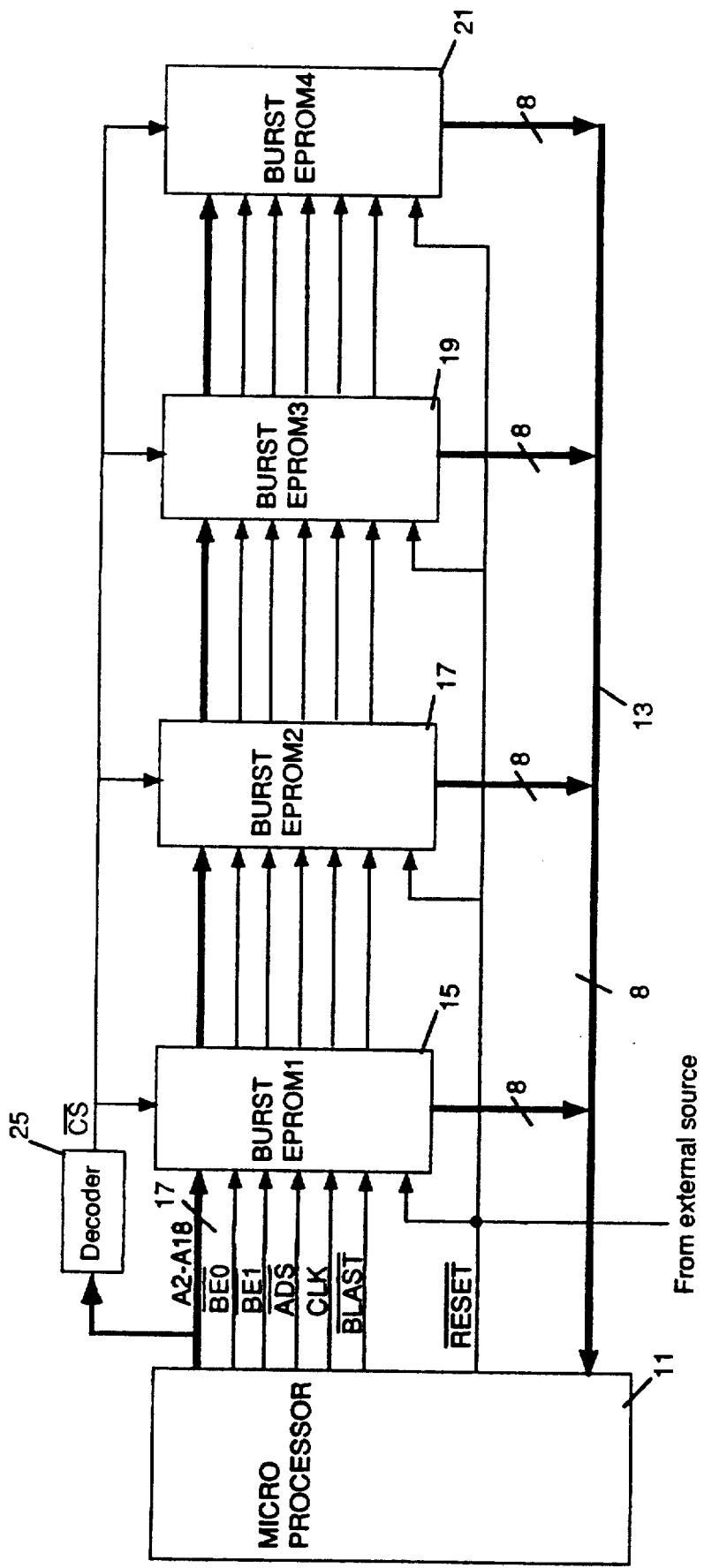
FIG. 9 is a block overview diagram showing burst EPROMs connected to a microprocessor in a fourth embodiment of the invention.

A fourth embodiment of the present invention is shown in FIG. 9 which shows a four burst EPROM configuration with an 8 bit data bus. In this configuration, since the addressed 8 bit bytes from each of burst EPROMs 15, 17, 19 and 21 cannot be placed onto the 8 bit data bus simultaneously, the signals /BE0 and /BE1 are used as chip select signals to select which of burst EPROMs 15, 17, 19 or 21 output is to be placed upon data bus 13 during each clock cycle.

We claim:

1. A circuit for coupling an EPROM (35) having an address space to a microprocessor to enable said EPROM to place on a data bus coupled to said microprocessor a plurality of consecutive byes of data in bursts wherein there is at least one wait state between adjacent ones of said bursts of said plurality of bytes of data, and zero wait states between adjacent ones of said plurality of bytes of data, said microprocessor generating a clock signal, an address on an address bus, an address strobe signal for indicating valid address and the beginning of an access for said data bus, and a burst last signal for indicating the last transfer in said access for said data bus, said address causing a chip select signaled to be asserted by an address decoder means when the address on said address bus is within the address spaced of said EPROM, said circuit comprising:

a) an address latch (33) coupled to said address but for latching said address from said address bus when said address latch is asserted by an address latch signal, said address specifying said plurality of consecutive bytes of data for accessing said EPROM;

b) first means (31) coupled to said address latch and said microprocessor for receiving said address strobe signal, said burst last signal, said clock signal and said chip select signal and controlling said address latch signal, a data latch load signal for causing said plurality of bytes of data from said EPROM to be loaded, an output enable load signal for enabling said data to be load to said data bus and a plurality of byte select signals corresponding to said plurality of bytes, said first means comprising a state machine having at least an idle state, a boot state, a wait state, first, second, third and fourth data-out states, said first means generating said address latch signal to said address latch during a wait state, said first means generating said plurality of consecutive bytes one byte according to said clock signal after said wait state during a burst access, the ordering of said consecutive bytes being based on said plurality of byte selected signals, said burst access being terminated by said burst last signal;

c) burst bus means (37) coupled to said first means and said EPROM for storing one byte of data during a predetermined clock cycle from said EPROM as determined by said address on said address bus and said plurality of byte select signals and transferring said stored byte to a corresponding output buffer (39) coupled to said data bus, said burst bus means receiving said plurality of bytes of data from said EPROM as specified by said address from said address latch when said data latch load is asserted by said first means.

2. The circuit defined in claim 1 wherein during said idle state, if said address strobe signal and said chip select signal are asserted, said state machine proceeds to said wait state, and while in said idle state, said data latch load signal is enabled, said address latch signal is enabled and said output enable load signal is disabled..

3. The circuit defined in claim wherein during said wait state, said state machine proceeds to said first data out state if said burst last signal is not asserted and returns to said idle state if said burst last signal is asserted, and while in said wait state, said address latch signal is not asserted.

4. The circuit defined in claim 1 wherein during said first data out state, said state machine proceeds to said second data out state if said burst last signal is not asserted, returns to said wait state if at least one of said burst last, said chip select and said address strobe signals are asserted, and returns to said idle state if said burst last signal is asserted and at least one of said address strobe signal is not asserted and said chip select signal is not asserted, and while in said first data out state, said address latch signal is asserted, said data latch load signal is not asserted and said output enable load signal is asserted.

5. The circuit defined in claim 1 wherein during said second data out state, said state machine proceeds to said third data out state if said burst last signal is not asserted and returns to said wait state if at least one of said burst last, said chip select and said address strobe signals are asserted, and returns to said idle state if said burst last signal is asserted and at least one of said address strobe signal is not asserted and said chip select signal is not asserted, and while in said second data out state, said address latch signal is asserted, said data latch load signal is not asserted and said output enable load signal is asserted.

6. The circuit defined in claim 1 wherein during said third data out state, said state machine proceeds to said fourth data out state if said burst last signal is not asserted and returns to said wait state if at least one of said burst last, said chip select and said address strobe signals are asserted, and returns to said idle state if said burst last signal is asserted and at least one of said address strobe signal is not asserted and said chip select signal is not asserted, and while in said third data out state, said address latch signal is asserted, said data latch load signal is not asserted and said output enable load signal is asserted.

7. The circuit defined in claim 1 wherein during said fourth data out state, said state machine proceeds to said boot state if said burst last signal is not asserted and returns to said wait state if at least one of said burst last, said chip select and said address strobe signals are asserted, and returns to said idle state if said burst last signal is asserted and at least one of said address strobe signal is not asserted and said chip select signal is not asserted, and while in said fourth data out state, said address latch signal is asserted, said data latch load signal is not asserted and said output enable load signal is asserted.

8. The circuit defined in claim 1 wherein during said boot state, said state machine goes to said idle state if said burst last signal is asserted and said chip select signal is not asserted and stays in said boot state if one of said chip select signal is asserted and said burst last signal is not asserted, and while in said boot state, said address latch signal is asserted, said data latch load signal is not asserted and said output enable load signal is asserted.

9. The circuit defined by claim 1 wherein said burst bus means includes a plurality of burst bus blocks, each of said burst bus blocks comprising:

a) a plurality of data latches (61a–61d) corresponding to said plurality of bytes coupled to said first means and said EPROM, each of said plurality of data latches for receiving a corresponding one of said plurality of byte select signals, said data latch load signal and storing one bit from a corresponding one of said plurality of bytes;

b) an output latch (65) coupled to said plurality of data latches for storing a bit from one of said plurality of data latches based upon said plurality of byte select signals and said clock signal and generating PDOUT and NDOUT signals for respectively controlling pull-up and pull-down devices in said corresponding output buffer;

c) an output enable latch (63) coupled to said output latch and said first means for receiving said output enable load signal, said burst last signal and said clock signal and generating a signal which causes said output latch to generate said PDOUT and said NDOUT signals based upon said bit stored in said output latch.

* * * * *

UNITED STATES PATENT AND TRADEMARK OFFICE
CERTIFICATE OF CORRECTION

PATENT NO. : 5,159,672
DATED : October 27, 1992
INVENTOR(S) : Joseph H. Salmon et al It is certified that error appears in the above-indentified patent and that said Letters Patent is hereby corrected as shown below:

| | | |
|---|---|---|
| Col. 2, Line 32 | Delete "EFROMs" | Insert --EPROMS-- |
| Col. 5, Line 60 | Delete "beddetermined" | Insert --be determined-- |
| Col. 6, Line 3 | Delete "f" | Insert --of-- |
| Col. 7, Line 63 | Delete "signaled" | Insert --signal-- |
| Col. 7, Line 65 | Delete "spaced" | Insert --space-- |
| Col. 8, Line 14 | Delete "first ," | Insert --first,-- |
| Col. 8, Line 21 | Delete "selected" | Insert --select-- |
| Col. 8, Line 40 | Delete ".." | Insert --.-- |
| Col. 8, Line 41 | Delete "claim" | Insert --claim 1-- |
| In the Abstract, line 4, delete "provude" | | Insert --provide-- |

Signed and Sealed this

Sixth Day of December, 1994

Attest:

BRUCE LEHMAN

*Attesting Officer* — *Commissioner of Patents and Trademarks*